(12) United States Patent
Choi

(10) Patent No.: US 7,543,106 B2
(45) Date of Patent: Jun. 2, 2009

(54) APPARATUS AND METHOD FOR CONTROLLING REFRESH OF SEMICONDUCTOR MEMORY DEVICE ACCORDING TO POSITIONAL INFORMATION OF MEMORY CHIPS

(75) Inventor: Joo-Sun Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 292 days.

(21) Appl. No.: 11/504,421

(22) Filed: Aug. 15, 2006

(65) Prior Publication Data

US 2007/0106838 A1      May 10, 2007

(30) Foreign Application Priority Data

Nov. 4, 2005    (KR)    ............... 10-2005-0105293

(51) Int. Cl.
    *G06F 12/16* (2006.01)
    *G11C 7/00* (2006.01)
(52) U.S. Cl. ................. 711/106; 711/5; 365/222
(58) Field of Classification Search ......... 711/5, 711/106; 365/222
    See application file for complete search history.

(56) References Cited

U.S. PATENT DOCUMENTS

| | | | |
|---|---|---|---|
| 6,166,972 A * | 12/2000 | Hidaka ............ | 365/200 |
| 6,483,764 B2 | 11/2002 | Hsu et al. | |
| 6,556,496 B2 | 4/2003 | Benedix et al. ............ | 365/222 |
| 7,317,648 B2 * | 1/2008 | Jo ............... | 365/222 |
| 7,362,643 B2 * | 4/2008 | Okada ............ | 365/222 |
| 2002/0136075 A1 | 9/2002 | Hsu et al. | |
| 2006/0104141 A1 * | 5/2006 | Jo ............... | 365/222 |

FOREIGN PATENT DOCUMENTS

| | | |
|---|---|---|
| JP | 07-176185 | 7/1995 |
| JP | 2001-043677 | 2/2001 |
| KR | 2003-0009052 | 1/2003 |
| KR | 10-2005-0007910 | 1/2005 |

OTHER PUBLICATIONS

Notice to Submit Response and English-language translation issued Sep. 21, 2006 in counter patent application No. 10-2005-0105293.

* cited by examiner

*Primary Examiner*—Jack A Lane
(74) *Attorney, Agent, or Firm*—Mills & Onello LLP

(57) ABSTRACT

A memory controller controlling a plurality of semiconductor memory devices includes a refresh control circuit controlling refresh operations of the semiconductor memory devices according to positional information of memory chips of the memory devices. The refresh control circuit classifies the semiconductor memory devices into first and second groups and sets an auto refresh interval of the semiconductor memory devices belong to the first group and an auto refresh interval of the semiconductor memory devices belong to the second group different from each other.

25 Claims, 12 Drawing Sheets

APPARATUS AND METHOD FOR CONTROLLING REFRESH OF SEMICONDUCTOR MEMORY DEVICE ACCORDING TO POSITIONAL INFORMATION OF MEMORY CHIPS

CROSS-REFERENCE TO RELATED PATENT APPLICATIONS

This application claims the benefit of Korean Patent Application No. 10-2005-0105293, filed on Nov. 4, 2005, in the Korean Intellectual Property Office, the contents of which are incorporated herein in their entirety by reference.

BACKGROUND OF THE INVENTION

1. Field of the Invention

The present invention relates to a semiconductor device, and more particularly, to a refresh circuit which adjusts a refresh interval of a semiconductor memory device according to the position of a semiconductor memory device or a group of memory devices to which the semiconductor memory device belongs in a memory system having a plurality of semiconductor memory devices, and a method thereof.

2. Description of the Related Art

As a semiconductor memory device and a system including the semiconductor memory device develop, the number of memory devices included in a single module or memory system is gradually increased. For example, for a computer, one or more memory modules including a plurality of DRAM chips are included.

To embody a large capacity memory module, a variety of schemes are used, for example, the DRAM chips are mounted on the upper and lower sides of the module or a plurality of DRAM chips are sequentially stacked.

When several DRAM chips are included in a single module or several memory modules are included in a single system, heat of the DRAM chip can be a serious problem. In particular, when a plurality of DRAM chips are positioned in a narrow area, the temperature of a chip varies according to the position thereof.

For example, for a memory module having a stack structure, thermal dissipation of the DRAM chip located on the lower side is inferior to that of the DRAM chip located on the upper side. To solve this problem, a heat spreader or heat sink exhibiting low heat resistance can be installed on the surface of the DRAM chip located on the upper side of a memory module. However, it is still difficult to overcome a temperature difference according to the position of the DRAM chip. Thus, when a plurality of memory chips is located on one or more modules, the temperature difference exists according to the position of the memory chip.

A DRAM stores data in a cell capacitor. That is, data is stored in a capacitor of a DRAM cell in form of electric charges. However, since the capacitor is not perfect, the stored electric charges are lost as time passes. Thus, before the data stored in the capacitor is completely lost, a refresh operation to detect/amplify data and rewrite the data is needed. A DRAM refresh method can be an auto refresh method or a self-refresh method. Since both methods are well known techniques, detailed descriptions thereof will be omitted herein.

When the temperature of the DRAM is high, the loss of electric charges in the cell capacitor becomes faster. Thus, when the temperature of the DRAM is high, a refresh interval needs to be shortened. For this reason, there have been efforts to change the refresh interval according to the temperature. To change the refresh interval according to the temperature, in the conventional technique, a temperature sensor is provided inside the DRAM chip so that the refresh interval is controlled according to the temperature sensed by the temperature sensor.

However, according to the above conventional technique, not only is a complicated temperature sensing circuit required, but also reliability or detection performance of the temperature sensing circuit is not high.

SUMMARY OF THE INVENTION

To solve the above and/or other problems, the present invention provides a method and apparatus for controlling a refresh operation according to the position of a semiconductor memory device.

According to an aspect of the present invention, a memory controller controlling a plurality of semiconductor memory devices includes a refresh control circuit controlling refresh operations of the semiconductor memory devices. The refresh control circuit classifies the semiconductor memory devices into first and second groups and assigns a first auto refresh interval to the semiconductor memory devices of the first group and a second auto refresh interval to the semiconductor memory devices of the second group, the first and second auto refresh intervals being different.

In one embodiment, the semiconductor memory devices are classified into different groups according to memory banks.

In one embodiment, the refresh control circuit comprises: a refresh information storing portion storing refresh information of the first and second groups; and a command generation block controlling the auto refresh interval corresponding to the refresh information, generating an auto refresh command according to the controlled auto refresh interval, and transmitting the generated auto refresh command to the semiconductor memory devices of a corresponding group.

According to another aspect of the present invention, a memory system includes a memory controller and a memory module including semiconductor memory devices classified into first and second groups which input and output data by being respectively controlled by the memory controller. The memory controller comprises a refresh control circuit controlling a first auto refresh interval of the semiconductor memory devices of the first group and a second auto refresh interval of the semiconductor memory devices of the second group, the first and second auto refresh intervals being different.

In one embodiment, the refresh control circuit comprises: a refresh information storing portion storing refresh information of the first and second groups; and a command generation block controlling the auto refresh interval corresponding to the refresh information, generating an auto refresh command according to the controlled auto refresh interval, and transmitting the generated auto refresh command to the semiconductor memory devices of a corresponding group.

In one embodiment, the memory module has a structure in which the semiconductor memory devices of the first and second groups are mounted on opposite surfaces of a module substrate for each group.

In one embodiment, the memory module has a structure in which the semiconductor memory devices of the first and second groups are stacked on at least one surface of a module substrate in multiple layers, and the semiconductor memory devices of the first and second groups are classified into different groups according to the number of a layer of the multiple layers where the semiconductor memory devices are stacked.

According to another aspect of the present invention, a memory system includes at least one memory module. Each memory module includes semiconductor memory devices classified into first and second groups which input and output data by being respectively controlled by a memory controller. Each of the semiconductor memory devices of the first and second groups includes a refresh information storing circuit storing refresh information output from the memory controller and a refresh control circuit controlling a self-refresh interval according to the refresh information and performing a self-refresh operation according to the controlled self-refresh interval.

In one embodiment, the refresh control circuit comprises: a refresh period control portion generating a refresh clock signal having a variable frequency based on the refresh information; and a refresh counter sequentially generating a wordline address in response to the refresh clock signal.

In one embodiment, the refresh information storing circuit comprises an MRS (mode register set) circuit storing the refresh information in a mode register in response to an MRS command.

In one embodiment, the refresh information input to the semiconductor memory devices of the first group and the refresh information input to the semiconductor memory devices of the second group indicate different self-refresh intervals.

In one embodiment, the semiconductor memory devices of the first and second groups are classified into different groups according to memory banks.

In one embodiment, the memory module has a structure in which the semiconductor memory devices of the first and second groups are mounted on opposite surfaces of a module substrate for each group.

In one embodiment, the memory module has a structure in which the semiconductor memory devices of the first and second groups are stacked on at least one surface of a module substrate in multiple layers, and the semiconductor memory devices of the first and second groups are classified into different groups according to the number of a layer of the multiple layers where the semiconductor memory devices are stacked.

In one embodiment, the refresh information is transmitted with a self-refresh command by the memory controller.

In one embodiment, when receiving the self refresh command and the refresh information from the memory controller, the semiconductor memory devices of the first group changes the refresh information according to a predetermined rule and transmits the changed refresh information with the self-refresh command to the semiconductor memory devices of the second group.

According to another aspect of the present invention, a memory module includes semiconductor memory devices classified into first and second groups which input and output data by being respectively controlled by a memory controller. Each of the semiconductor memory devices of the first and second groups includes a refresh information storing circuit storing refresh information output from the memory controller, and a refresh control circuit controlling a self-refresh interval according to the refresh information and performing a self-refresh operation according to the controlled self-refresh interval.

In one embodiment, the refresh information input to the semiconductor memory devices of the first and second groups indicate different self-refresh intervals.

In one embodiment, the memory module has a structure in which the semiconductor memory devices of the first and second groups are stacked on at least one surface of a module substrate in multiple layers, and the semiconductor memory devices of the first and second groups are set to have different self-refresh intervals according to the number of a layer of the multiple layers where the semiconductor memory devices are stacked.

In one embodiment, the memory module further comprises semiconductor memory devices of third and fourth groups, the semiconductor memory devices of the first group are stacked on a first layer of a first surface of the module substrate, the semiconductor memory devices of the second group are stacked on a second layer of the first surface of the module substrate, the semiconductor memory devices of the third group are stacked on a third layer of the first surface of the module substrate, the semiconductor memory devices of the fourth group are stacked on a fourth layer of the first surface of the module substrate, and the self-refresh intervals of the semiconductor memory devices of the first through fourth groups become slower in order of the second, third, first, and fourth groups.

In one embodiment, the refresh information is transmitted with a self-refresh command by the memory controller.

In one embodiment, when receiving the self refresh command and the refresh information from the memory controller or other semiconductor memory devices, each of the semiconductor memory devices of the first through third groups changes the refresh information according to a predetermined rule and transmits changed refresh information with the self-refresh command to other semiconductor memory devices of the second group.

According to another aspect of the present invention, a method for controlling refresh of semiconductor memory devices classified into at least first and second groups on a memory module includes the semiconductor memory devices of the first and second groups receiving different refresh information from a memory controller and storing the received refresh information, receiving a self-refresh command from the memory controller, controlling a self-refresh interval according to the refresh information, and performing a self-refresh operation according to the controlled self-refresh interval.

In one embodiment, in the memory module having a structure in which semiconductor memory devices are stacked in multiple layers, the refresh information changes according to the number of a layer of the multiple layers where the semiconductor memory devices are stacked.

According to another aspect of the present invention, a method for controlling refresh of a plurality of semiconductor memory devices includes classifying the semiconductor memory devices into at least first and second groups, storing refresh information of the first and second groups, and controlling an auto refresh interval corresponding to the refresh information, generating an auto refresh command according to the controlled auto refresh interval, and transmitting the generated auto refresh command to the semiconductor memory devices of a corresponding group.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1A:
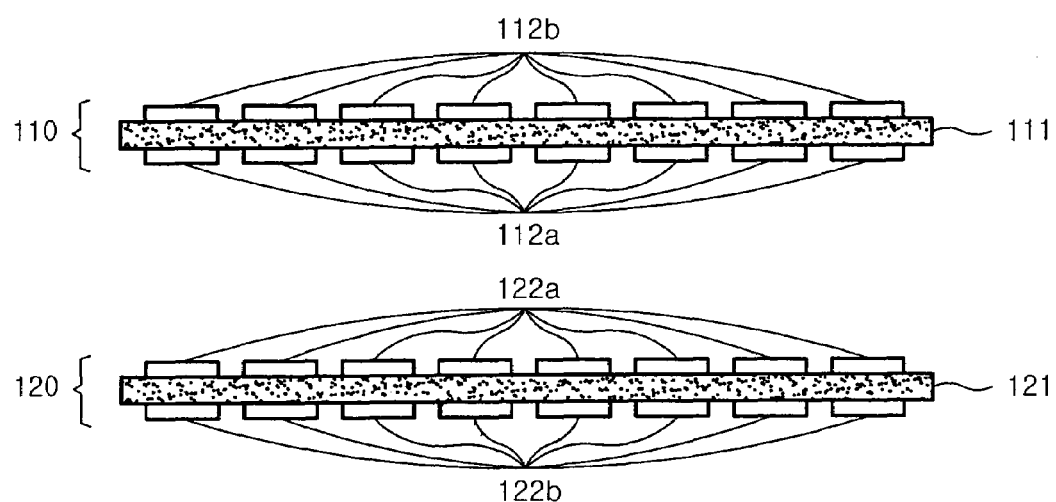
FIGS. 1A and 1B are views showing a memory system having a plurality of memory devices according to an embodiment of the present invention.
Figure 1B:
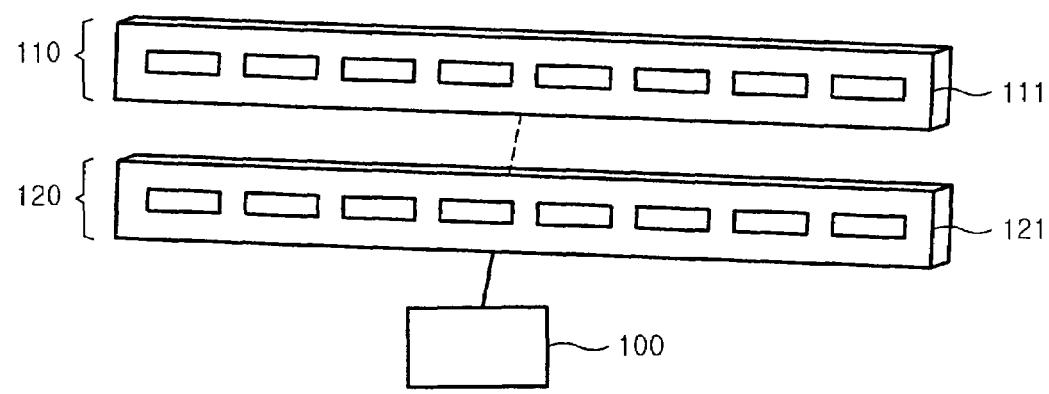

FIGS. 1A and 1B are views showing a memory system having a plurality of memory devices according to an embodiment of the present invention. In FIGS. 1A and 1B, the memory system includes two memory modules 110 and 120. FIG. 1A is a cross-sectional view of the memory modules 110 and 120. FIG. 1B is a perspective view of the memory modules 110 and 120 and a memory controller 100 controlling the memory modules 110 and 120.

Referring to FIGS. 1A and 1B, each of the memory modules 110 and 120 includes a plurality of memory devices 112a, 112b, 122a, and 122b on both sides of each of module boards 111 and 121. The memory devices of the memory system shown in FIGS. 1A and 1B can be divided into two groups according to the position thereof. A first group includes the semiconductor memory devices 112a and 122a located on the inner surfaces of the modules 110 and 120 that face each other. A second group includes the semiconductor memory devices 112b and 122b located on the outer surfaces of the modules 110 and 120. The temperature of the semiconductor memory devices 112a and 122a which belong to the first group is higher than that of the semiconductor memory devices 112b and 122b which belong to the second group.

Figure 2:
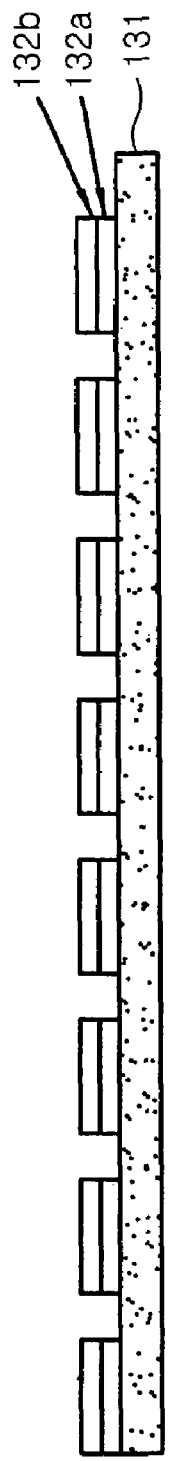
FIG. 2 is a block diagram of a memory system having a plurality of memory devices according to another embodiment of the present invention.

FIG. 2 is a block diagram of a memory system having a plurality of memory devices according to another embodiment of the present invention. The memory system of FIG. 2 includes a single memory module. The memory module includes a plurality of memory devices 132a and 132b which are stacked on a surface of a module board 131 in double layers.

In the memory system of FIG. 2, the memory devices 132a and 132b can be divided into two groups according to the position thereof. A first group includes the semiconductor memory devices 132a which are located in the lower portion of the stack and belong to the first layer with respect to the module board 131. A second group includes the semiconductor memory devices 132b which are located in the upper portion of the stack and belong to the second layer with respect to the module board 131. The temperature of the semiconductor memory devices 132a which belong to the first group is higher than that of the semiconductor memory devices 132b which belong to the second group.

Figure 3:
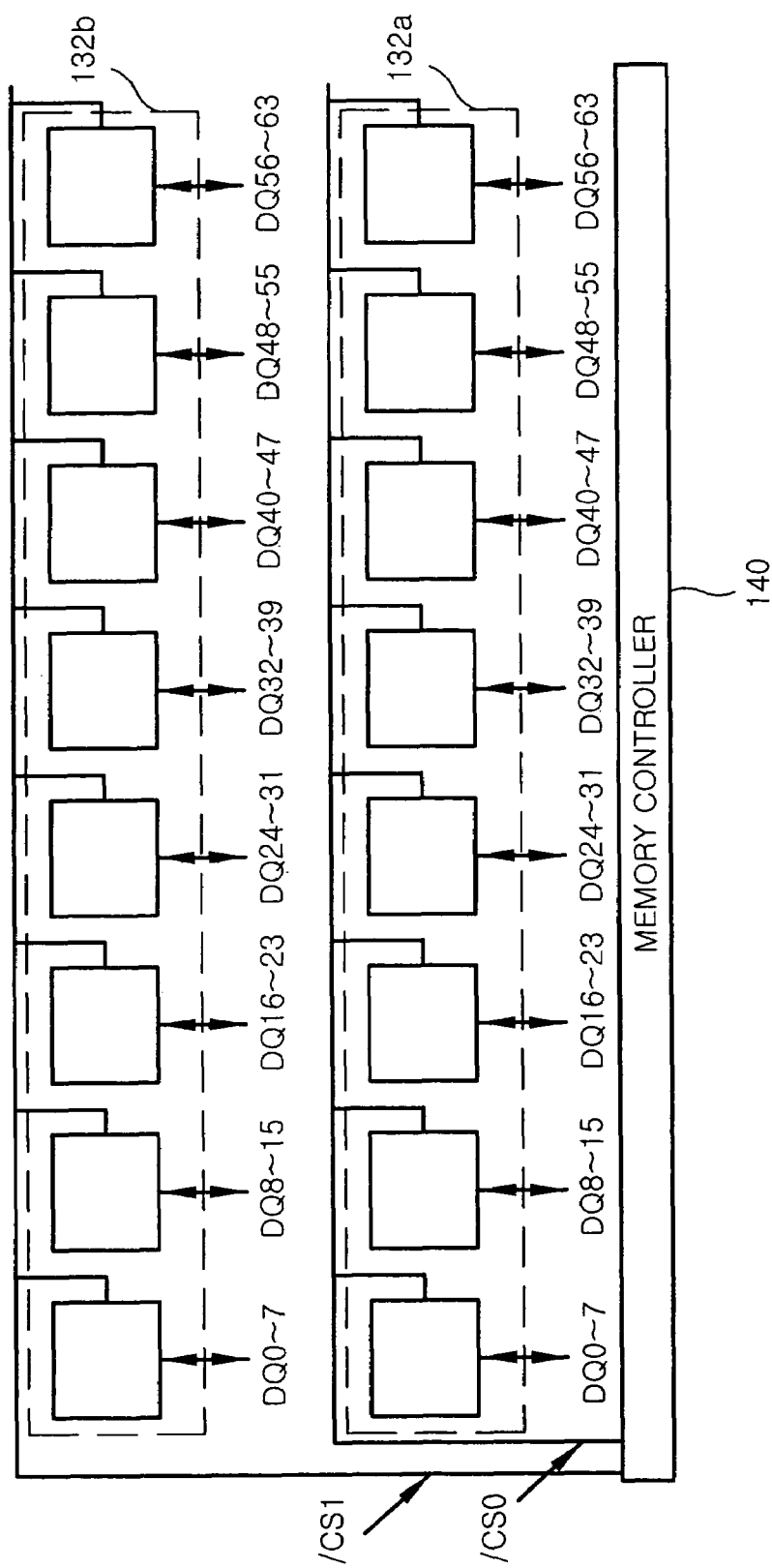
FIG. 3 is a view showing the connection between the memory devices and a memory controller in the memory system of FIG. 2.

FIG. 3 is a view showing the connection between the memory devices 132a and 132b and a memory controller 140 in the memory system of FIG. 2. Referring to FIG. 3, the controller 140 and the memory devices 132a and 132b are connected in a multi-drop method. Eight memory devices constitute a single rank. The rank means memory devices which are simultaneously controlled by the memory controller 140. For example, when the memory control 140 receives and outputs data by 64 bits (X64) and each memory device receives and outputs data by 8 bits (X8), eight memory devices can constitute a single rank.

Referring to FIG. 3, the memory devices 132a of the first group are controlled by a control signal /CS0 while the memory devices 132b of the second group are controlled by a control signal /CS1. That is, when the controller 140 low-enables/CS0, the memory devices 132a of the first group are selected while the memory devices 132b of the second group are selected when the controller 140 low-enables/CS1. Data is received and outputted by 8 bits per DRAM. Thus, the controller 140 simultaneously receives or outputs 64-bit data. That is, the controller 140 is operated in X64.

Figure 4:
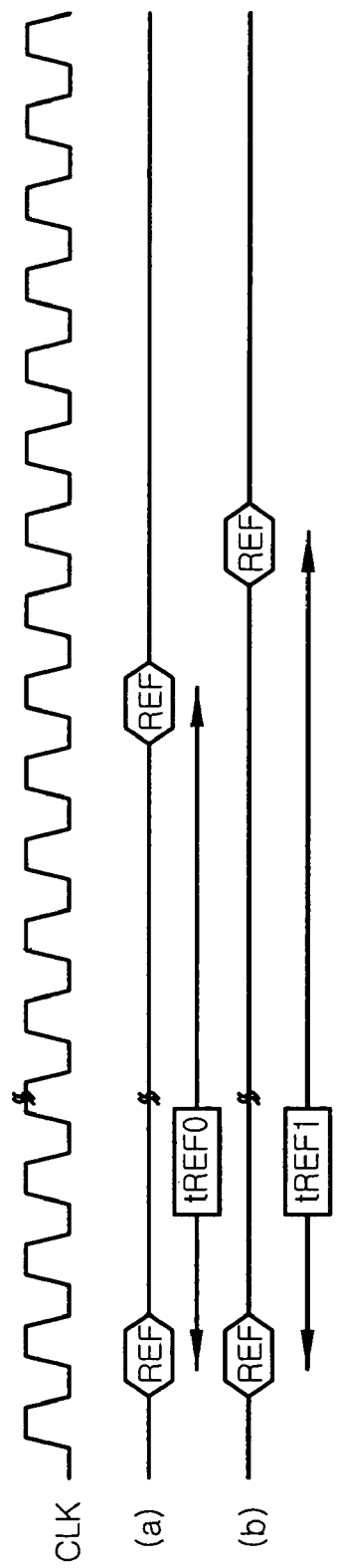
FIG. 4 is a timing diagram for explaining a method of controlling refresh according to an embodiment of the present invention.

FIG. 4 is a timing diagram illustrating a method of controlling refresh according to an embodiment of the present invention. The refresh control method according to the present embodiment is a method that is applied to auto refresh operation.

The refresh control method according to the present embodiment will be described based on an assumption that the method is applied to the exemplary memory system of FIG. 3. However, the method can be applied to a memory system having a structure different from that of the memory system of FIG. 3.

Referring to FIG. 4, the controller 140 sends an auto refresh command (REF) to the semiconductor memory devices 132a and 132b. Then, the semiconductor memory devices 132a and 132b perform a refresh operation in response to the auto refresh command REF received from the memory controller 140. The controller 140 sets an interval tREF0 (hereinafter, referred to as "refresh interval") between the auto refresh commands sent to the semiconductor memory devices 132a which belong to the first group to be different from a refresh interval tREF1 between the auto refresh commands sent to the semiconductor memory devices 132b which belong to the second group. In FIG. 4, line (a) denotes the refresh interval tREF0 between the auto refresh commands with respect to the semiconductor memory devices 132a of the first group while line (b) denotes the refresh interval tREF1 between the auto refresh commands with respect to the semiconductor memory devices 132b of the second group.

When the temperature of the semiconductor memory devices 132a of the first group is higher than that of the semiconductor memory devices 132b of the second group, it is preferable that the first refresh interval tREF0 is shorter than the second refresh interval tREF1, that is, tREF0<tREF1. The refresh interval signifies an interval between refresh of a wordline and refresh of another wordline. The time to refresh all wordlines is referred to as a refresh period. Thus, when the refresh interval is constant, the refresh period can be obtained by an expression of refresh interval×the number of wordlines.

Figure 5:
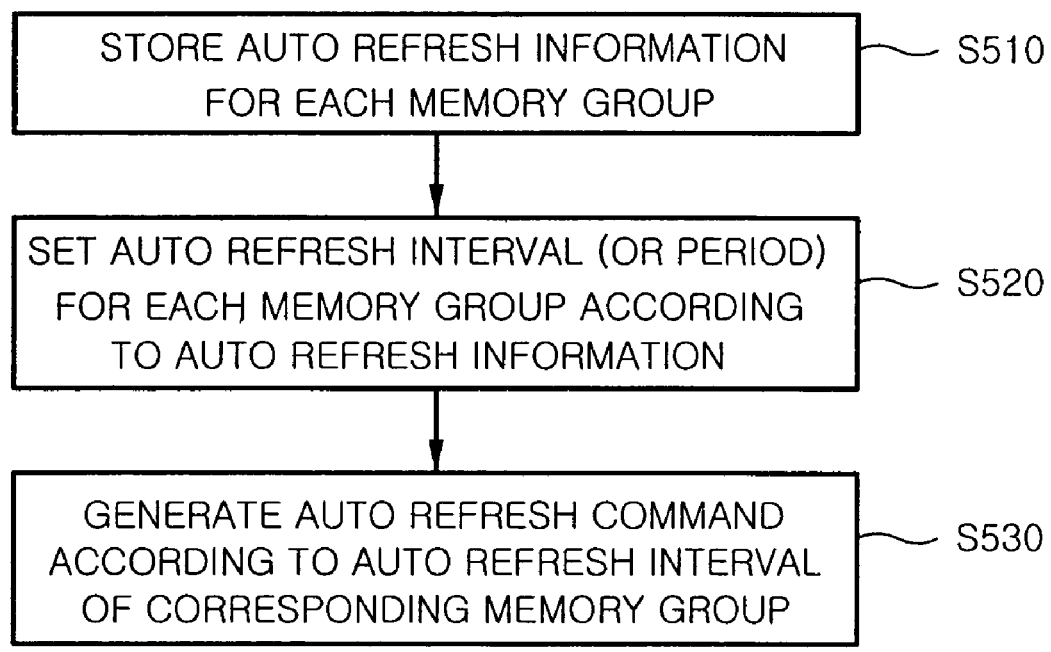
FIG. 5 is a flowchart showing the refresh control method of FIG. 4.
Figure 6:
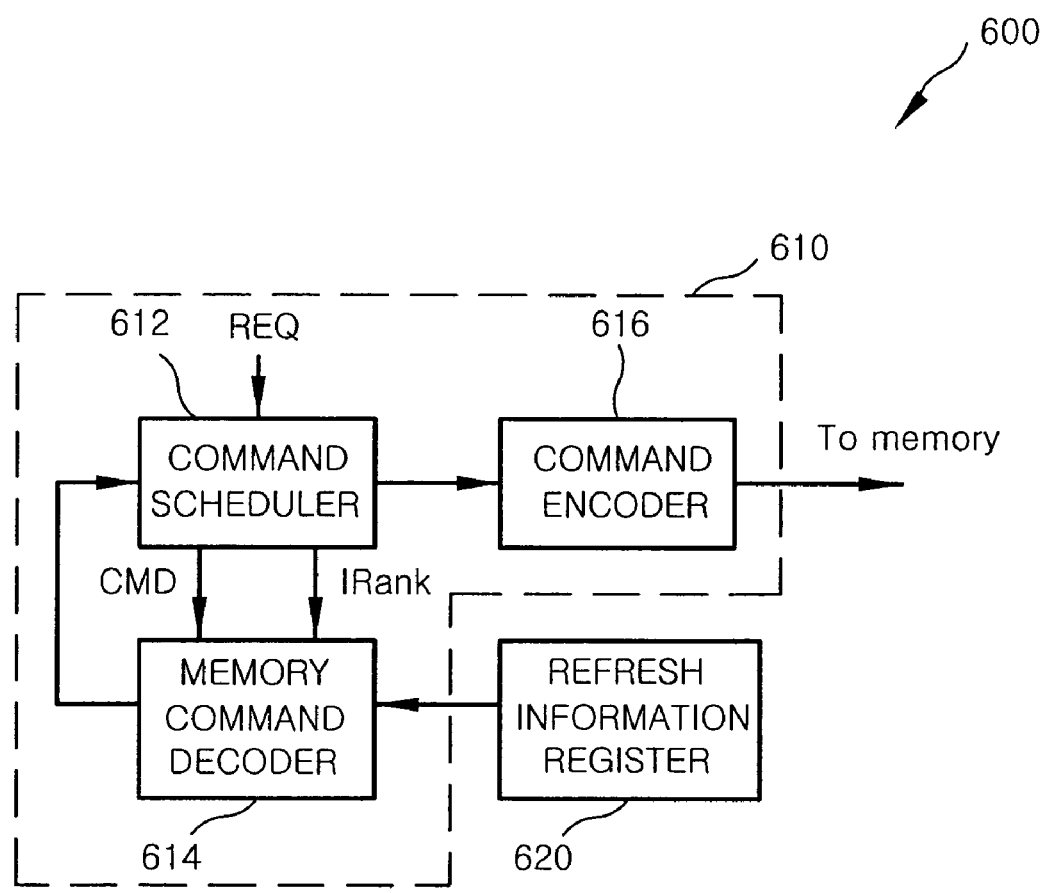
FIG. 6 is a block diagram showing the internal structure of a memory controller to perform the refresh control method of FIG. 4.

FIG. 5 is a flowchart showing the refresh control method of FIG. 4. FIG. 6 is a block diagram showing the internal structure of a memory controller 600 to perform the refresh control method of FIG. 4. Referring to FIGS. 5 and 6, a refresh control method using the memory controller 600 is described as follows.

A controller stores auto refresh information for each group (S510). The auto refresh information is a value that reflects a temperature difference according to the position of the memory devices, which determines the refresh interval (or period). The auto refresh information is separately set for each memory device according to the position of each memory device. However, when the controller controls each memory not separately but for each memory group, for example, for each bank, the auto refresh information can be set for each memory group. The auto refresh information for each memory group is stored in a refresh information register 620 (S510).

When the auto refresh information is stored or set, the auto refresh interval for each group is set or adjusted according to the auto refresh information (S520). In the instance of the memory system of FIG. 3, the auto refresh information for the first and second groups are respectively set to "00" and "01". The value of a refresh interval corresponding to each of the auto refresh information "00" and "01" can be determined in advance through tests or simulation.

When the auto refresh interval according to the auto refresh information is set, an auto refresh command is generated according to the set auto refresh interval and transmitted to the memory devices of a corresponding memory group (S530). Operations S520 and S530 are performed at a command generation block 610.

Referring to FIG. 6, the memory controller 600 includes a register 620 for storing refresh information and the command generation block 610. The command generation block 610 includes a command scheduler 612, a memory command decoder 614, and a command encoder 616. The command scheduler 612 generates auto refresh command CMD according to a predetermined work request REQ and sends the generated auto refresh command to the memory command decoder 614 with memory group information. The memory group is classified by rank. Thus, rank information Irank is sent to the memory command decoder 614 with the refresh command CMD. When the memory command decoder 614 decodes the received command and identifies the command as the auto refresh command CMD, the auto refresh information corresponding to a rank corresponding thereto is received from the refresh information register 620. The memory command decoder 614 sets an auto refresh interval with respect to a corresponding rank according to the received auto refresh information, and informs the command scheduler 612 of an effective time of the auto refresh command according to the set auto refresh interval. Then, the command scheduler 612 generates the auto refresh command at the corresponding time and the generated auto refresh command is encoded by the command encoder 616 to be transmitted to the corresponding memory device(s).

Figure 7:
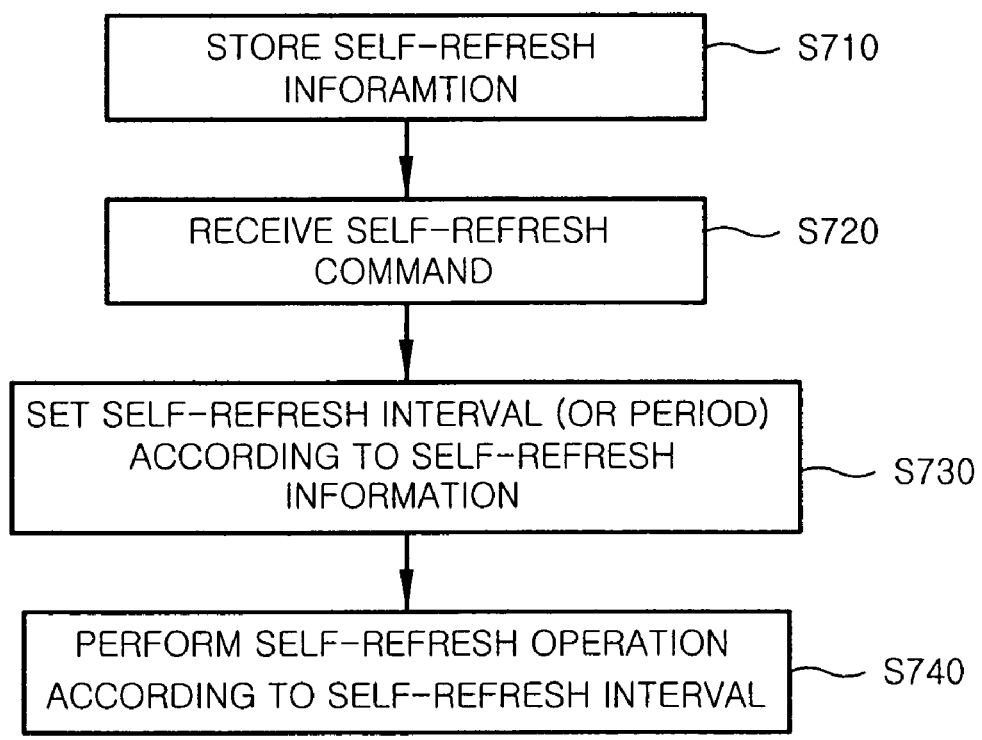
FIG. 7 is a flowchart showing a method of controlling refresh according to another embodiment of the present invention.

FIG. 7 is a flowchart showing a method of controlling refresh according to another embodiment of the present invention. The refresh control method according to the present embodiment is applied to a self-refresh operation.

Referring to FIG. 7, each semiconductor memory device stores self-refresh information which is different position-by-position or group-by-group (S710). The self-refresh information is a value that reflects the temperature difference according to the positions of the memory devices and determines a refresh interval (or period).

The self-refresh information is preferably stored in mode registers in a mode register set (MRS) circuit. Each semiconductor memory device receives from a controller an MRS command to store the self-refresh information and, in response to the MRS command, stores the self-refresh information in the mode register (S710). Like the auto refresh information, the self-refresh information reflects the temperature difference according to the position of the memory device and is assigned a different value according to the memory apparatus or the memory group. It is preferred that the memory group is classified by rank that is simultaneously controlled by the controller.

After the self-refresh information is stored in each semiconductor memory device, a self-refresh command is received from the controller (S720). When the self-refresh command is received from the controller, the semiconductor memory device sets a self-refresh interval according to the self-refresh information stored in the mode register (S730). A self-refresh operation is performed according to a set self-refresh interval (S740).

Figure 8:
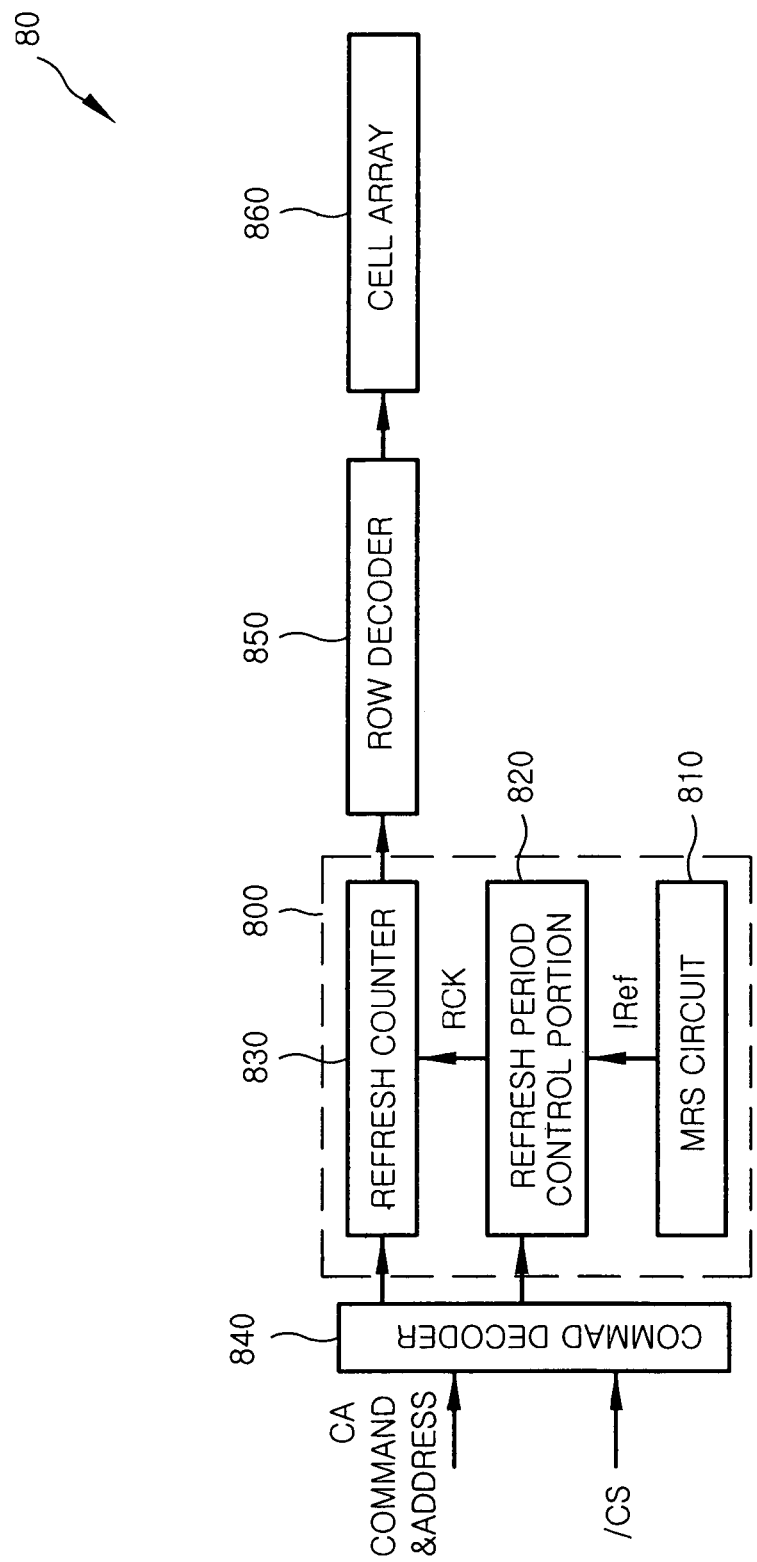
FIG. 8 is a block diagram of a semiconductor memory device including a refresh control circuit to perform the refresh control method of FIG. 7.

FIG. 8 is a block diagram of a semiconductor memory device including a refresh control circuit to perform the refresh control method of FIG. 7. Referring to FIG. 8, a semiconductor memory device 80 includes a refresh control circuit 800, a command decoder 840, a row decoder 850, and a cell array 860.

The command decoder 840 receives a chip selection signal /CS and a command signal CA COMMAND and determines the nature of the received command by decoding the received signals /CS and CA COMMAND. In addition to the chip selection signal "/CS" and the command signal CA COMMAND, an address signal ADDRESS is input to the command decoder 840 and used to determine the nature of the command transmitted from the controller. When the received signals /CS, CA COMMAND, and ADDRESS are determined to be self-refresh commands, the command decoder 840 transmits signals to a refresh period control portion 820 and a refresh counter 830 of the refresh control circuit 800 to enable the refresh period control portion 820 and the refresh counter 830.

The refresh control circuit 800 includes an MRS circuit 810, the refresh period control portion 820, and a refresh counter 830. The MRS circuit 810 sets a mode register in response to the MRS command. In particular, in response to the MRS command to set the self-refresh information, the MRS circuit 810 sets self-refresh information IRef in a predetermined field of the mode register.

The refresh period control portion 820 generates a refresh clock signal RCK whose period (or frequency) varies according to the self-refresh information IRef set in the mode register. For this purpose, the refresh period control portion 820 includes a plurality of oscillators or an oscillator having a changeable period.

Figure 9A:
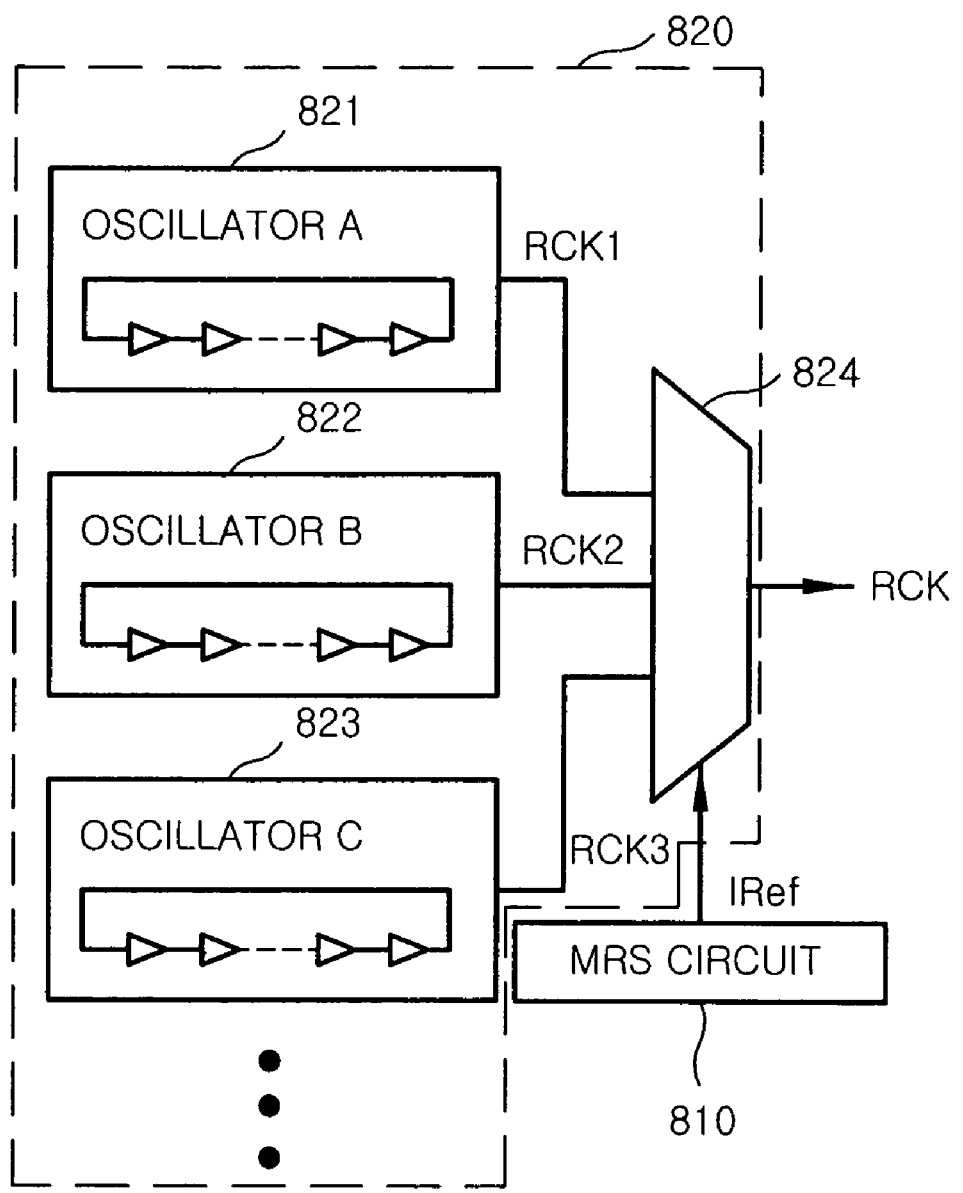
FIGS. 9A and 9B are views showing examples of the period control portion shown in FIG. 8.
Figure 9B:
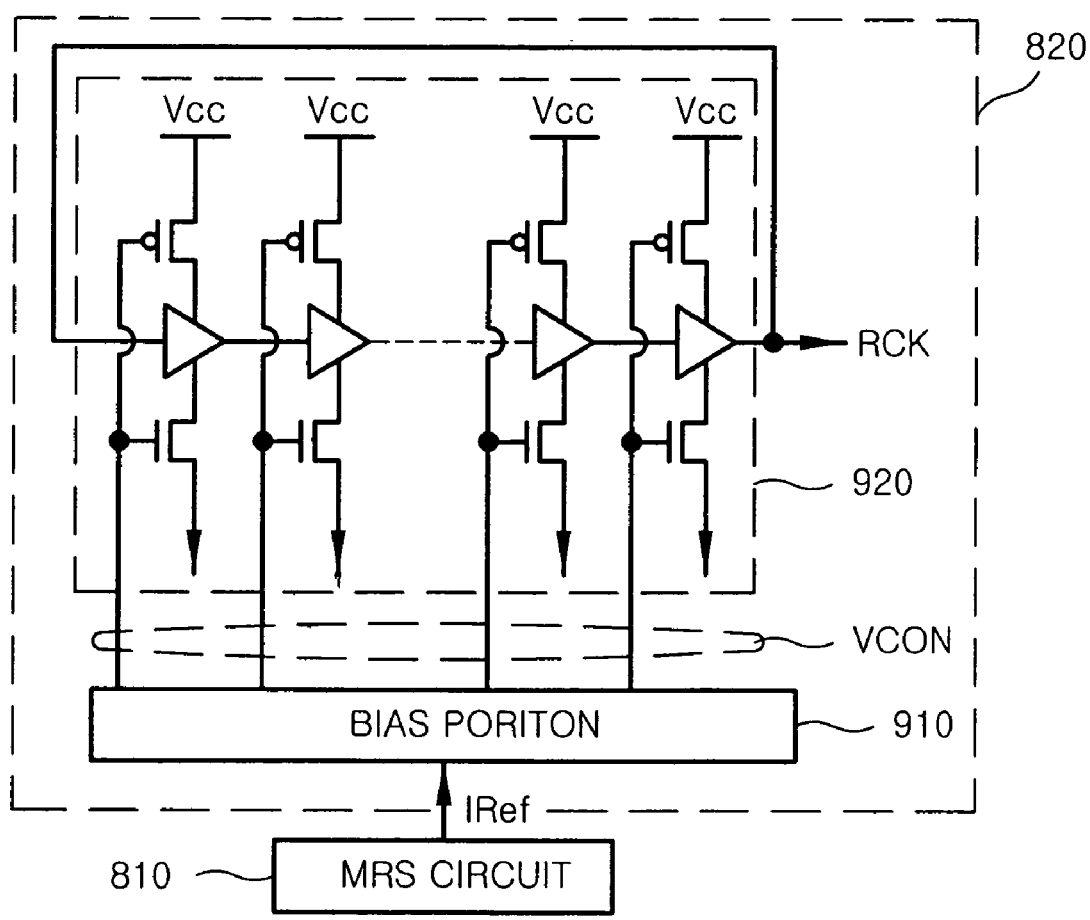

FIGS. 9A and 9B are views showing examples of the period control portion 820 of FIG. 8. Referring to FIG. 9A first, the period control portion 820 includes a plurality of oscillators 821, 822, and 823 and a multiplexer 824. The oscillators 821, 822, and 823 generate clock signals RCK1, RCK2, and RCK3 having different period. The multiplexer 824 selects one of the clock signals RCK1, RCK2, and RCK3 in response to the self-refresh information IRef.

Referring to FIG. 9B, the period control portion 820 includes a bias portion 910 and an oscillator 920. The bias portion 910 generates a control voltage VCON in response to the self-refresh information IRef. The oscillator 920 generates a refresh clock signal RCK having a variable period, according to the control voltage VCON.

Referring back to FIG. 8, the refresh counter 830 sequentially generates wordline addresses to refresh by counting in response to the refresh clock signal RCK. Thus, the self-refresh interval makes one period of the refresh clock signal RCK. The row decoder 850 decodes a wordline address output from the refresh counter 830 so that a wordline corresponding to a wordline address among a plurality of wordlines constituting the cell array 860 is selected.

In the present embodiment, the self-refresh information is set using the MRS circuit. However, in another embodiment, the self-refresh information can be set using a fuse programming method. For example, for a semiconductor memory device having no MRS circuit, a fuse circuit to set the self-refresh information is included and the self-refresh information is set to a specified value according to whether the fuse is cut or not. When the fuse circuit is used, since it is difficult to change the self-refresh information once it is set, it is preferable to set the self-refresh information using the MRS circuit.

In another embodiment, the self-refresh information is not previously set in each semiconductor memory device using the MRS circuit or fuse circuit, but is transmitted to the semiconductor memory device with a self-refresh command. This scheme can be applied to semiconductor memory devices using a command in a packet form, for example, a Rambus DRAM.

The present invention can be applied not only to the memory systems shown in FIGS. 1 and 2, but also to memory systems having various structures. In particular, as the number of layers of a memory module increases, the difference in the temperature between the memory devices increases. Thus, the present invention is very useful for a memory system having a stack structure.

Figure 10:
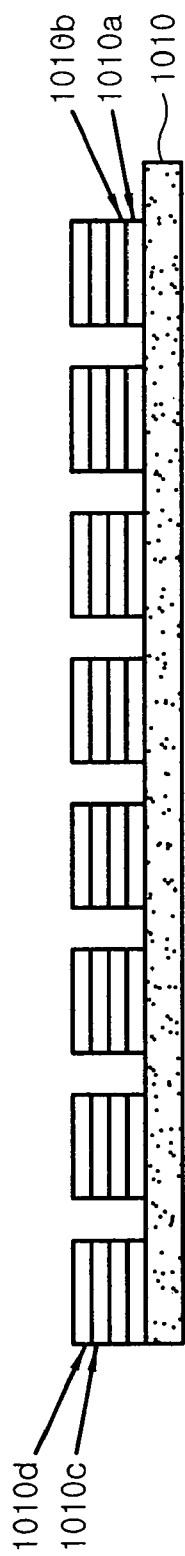
FIG. 10 is a block diagram of a memory system having a plurality of memory devices according to yet another embodiment of the present invention.

FIG. 10 is a block diagram of a memory system having a plurality of memory devices according to yet another embodiment of the present invention. The memory system shown in FIG. 10 includes a memory module. The memory module includes a plurality of memory devices having a structure in which four layers are stacked on one surface of a module substrate 1010.

In this case, the memory devices can be classified into four groups according to the position of the memory device, in detail, the number of a layer where the memory device is stacked. In the stack structure shown in FIG. 10, the temperature of a semiconductor memory device 1010*b* belonging to a second group is highest. The temperature of a semiconductor memory device 1010*c* belonging to a third group is next higher. The temperature of a semiconductor memory device 1010*a* belonging to a first group is next higher. The temperature of a semiconductor memory device 1010*d* belonging to a fourth group is lowest. Thus, as shown in FIG. 10, in a memory module having a structure in which the semiconductor memory device is stacked in multiple layers (here, in four layers), it is preferable to classify the memory groups or set the refresh information (auto refresh information and/or self-refresh information) to be different, according to the number of a layer where the semiconductor memory device is stacked.

Figure 11:
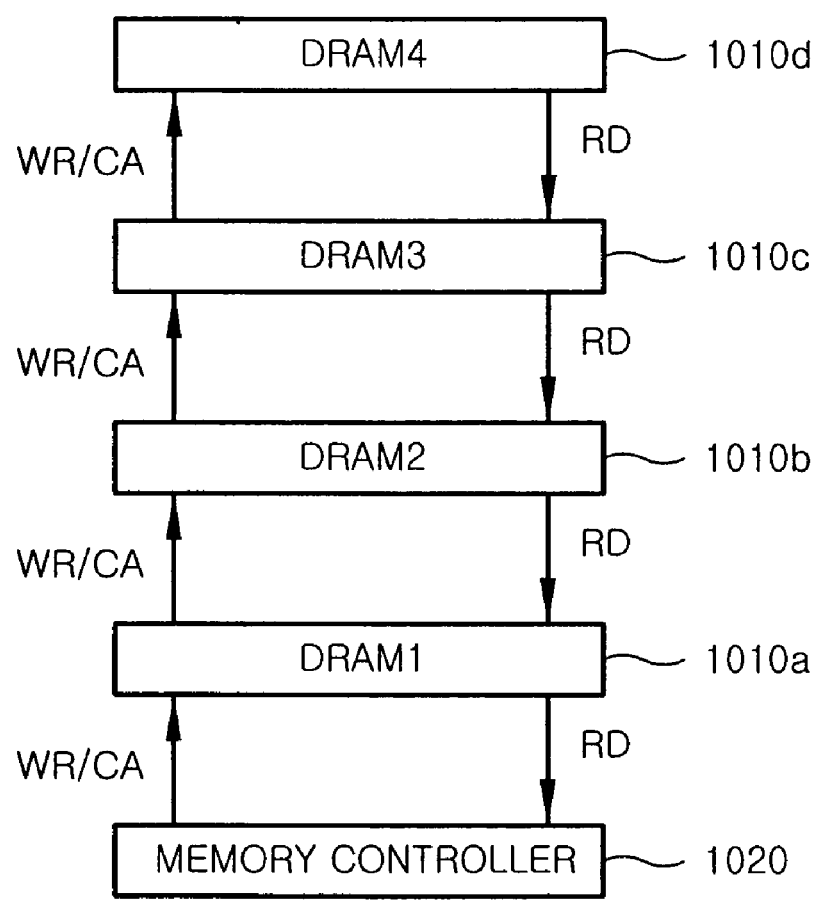
FIG. 11 is a view showing the connection between the memory devices and a memory controller in the memory system of FIG. 10.

FIG. 11 is a view showing the connection between the memory devices and a memory controller in the memory system of FIG. 10. Referring to FIG. 11, a controller 1020 is connected to the first group semiconductor memory device 1010*a*, the first group semiconductor memory device 1010*a* is connected to the second group semiconductor memory device 1010*b*, the second group semiconductor memory device 1010*b* is connected to the third group semiconductor memory device 1010*c*, and the third group semiconductor memory device 1010*c* is connected to the fourth group semiconductor memory device 1010*d*.

Write data WR stored in the semiconductor memory device and read data RD read from the semiconductor memory device are transmitted through different transmission lines. Command and address CA is transmitted through the same transmission line as that for the write data WR. All signals between the memory controller 1020 and the first group semiconductor memory device 1010*a* are transmitted in a point-to-point method. Likewise, all signals between the first group semiconductor memory device 1010*a* and the second group semiconductor memory device 1010*b*, the second group semiconductor memory device 1010*b* and the third group semiconductor memory device 1010*c*, and the third group semiconductor memory device 1010*c* and the fourth group semiconductor memory device 1010*d* are also transmitted in the point-to-point method.

The write data WR or command and address CA can be transmitted from the memory controller 1020 to the fourth group semiconductor memory device 1010*d* through a repeater of each of the semiconductor memory devices 1010*a*, 1010*b*, 1010*c*, and 1010*d*. In detail, the write data WR or command and address CA that is finally transmitted to the fourth group semiconductor memory device 1010*d* is transmitted from the memory controller 1020 to the first group semiconductor memory device 1010*a*. The first group semiconductor memory device 1010*a* receives the write data WR or command and address CA from the memory controller 1020 and transmits the same to the second group semiconductor memory device 1010*b* via the repeater. Likewise, the second and third group semiconductor memory devices 1010*b* and 1010*c* transmit the write data WR or command and address CA to the third and fourth group semiconductor memory devices 1010*c* and 1010*d*, respectively, via the repeater.

The read data RD is transmitted to the memory controller 1020 via the repeater of each of the semiconductor memory devices 1010*a*, 1010*b*, 1010*c*, and 1010*d*.

In a memory system having a link structure, the self-refresh command can be transmitted in packet command form with the self-refresh information from the memory controller 1020 and sequentially from the first group semiconductor memory device 1010*a* and the fourth group semiconductor memory device 1010*d*. When the self-refresh command is transmitted, the self-refresh information can be transmitted together in a packet. In particular, the self-refresh information in a packet can be embodied to be increased by 1 every time the self-refresh command is repeated. For example, when the memory controller 1020 transmits the self-refresh command to the first group semiconductor memory device 1010*a*, the self-refresh information is set to "00". When the first group semiconductor memory device 1010*a* transmits the self-refresh command to the second group semiconductor memory device 1010*b*, the self-refresh information is set to "01". When the second group semiconductor memory device 1010*b* transmits the self-refresh command to the third group semiconductor memory device 1010*c*, the self-refresh information is set to "10". When the third group semiconductor memory device 1010*c* transmits the self-refresh command to the fourth group semiconductor memory device 1010*d*, the self-refresh information is set to "11". The respective semiconductor memory devices set the self-refresh interval according to the self-refresh information received with the self-refresh command and perform a self-refresh operation according to the set self-refresh interval.

To perform the self-refresh operation, each of the semiconductor memory devices 101a, 101b, 1010c, and 1010d includes the refresh control circuit 800 as shown in FIG. 8. The refresh control circuit of each of the semiconductor memory devices 101a, 101b, 1010c, and 1010d selects a first fast (fastest) refresh interval when the self-refresh information is "01", a second fast refresh interval when the self-refresh information is "10", a third fast refresh interval when the self-refresh information is "00", and a fourth fast (slowest) refresh interval when the self-refresh information is "11". Of course, by setting the second and third group semiconductor memory devices 1010b and 1010c as a group and the first and fourth group semiconductor memory devices 1010a and 1010d as another group, the refresh interval of the second and third group semiconductor memory devices 1010b and 101c can be set different from that of the first and fourth group semiconductor memory devices 1010a and 1010d.

For the auto refresh, the refresh information does not need to be transmitted to the respective semiconductor memory devices 1010a, 1010b, 1010c, and 1010d. In this case, the memory controller 1020 sets the auto refresh information different according to the number of a layer of the multiple layers where each of the semiconductor memory devices 1010a, 1010b, 1010c, and 1010d is stacked. The auto refresh command is transmitted according to the refresh interval corresponding to the set auto refresh information. Since the time assigned to transmission of the refresh operation in the whole system including the semiconductor memory devices is used for data integrity regardless of reading and writing data with respect to the memory device, the time can be regarded as waste time compared to the overall access time. In the present invention, since the refresh time is optimized according to the position of each semiconductor memory device, an extra time obtained thereby can be used for data access so that it is advantageous in the view of memory bandwidth.

While this invention has been particularly shown and described with reference to preferred embodiments thereof, it will be understood by those skilled in the art that various changes in form and details may be made therein without departing from the spirit and scope of the invention as defined by the appended claims.

As described above, according to the present invention, the refresh operation is controlled according to the position of the semiconductor memory device. Thus, in a memory system including a plurality of memory devices, the refresh operation of each memory device can be controlled considering the difference in temperature according to the position of the memory device. Accordingly, for a memory device exhibiting a relatively higher temperature, the refresh time is shortened so that reliability of data is improved. Conversely, for a memory device exhibiting a relatively lower temperature, the refresh time is extended so that current consumption due to the refresh operation can be reduced.

Also, since the refresh time according to the position of each semiconductor memory device included in the memory system is optimized, an extra time obtained thereby can be used for data access so that the memory bandwidth is increased.

What is claimed is:

1. A memory controller controlling a plurality of semiconductor memory devices, the memory controller comprising:
a refresh control circuit controlling refresh operations of the semiconductor memory devices,
wherein the refresh control circuit classifies the semiconductor memory devices into first and second groups according to a position of the semiconductor memory devices, wherein temperature of the semiconductor memory devices varies based on the position of the semiconductor memory devices, and sets a first auto refresh interval of the semiconductor memory devices that belong to the first group and a second auto refresh interval of the semiconductor memory devices that belong to the second group, the auto refresh intervals being different from each other, wherein the refresh control circuit comprises a refresh information storing portion storing refresh information of the first and second groups, wherein the refresh information reflects the temperature variation with the position of the semiconductor memory devices.

2. The memory controller of claim 1, wherein the semiconductor memory devices are classified into different groups according to memory banks.

3. The memory controller of claim 1, wherein the refresh control circuit further comprises:
a command generation block controlling the auto refresh interval corresponding to the refresh information, generating an auto refresh command according to the controlled auto refresh interval, and transmitting the generated auto refresh command to the semiconductor memory devices of a corresponding group.

4. A memory system comprising:
a memory controller; and
a memory module including semiconductor memory devices classified into first and second groups according to a position of the semiconductor memory devices which input and output data by being respectively controlled by the memory controller, wherein temperature of the semiconductor memory devices varies based on the position of the semiconductor memory devices,
wherein the memory controller comprises a refresh control circuit controlling a first auto refresh interval of the semiconductor memory devices that belong to the first group and a second auto refresh interval of the semiconductor memory devices that belong to the second group, the auto refresh intervals being different from each other, wherein the refresh control circuit comprises a refresh information storing portion storing refresh information of the first and second groups, wherein the refresh information reflects the temperature variation with the position of the semiconductor memory devices.

5. The memory system of claim 4, wherein the refresh control circuit further comprises:
a command generation block controlling the auto refresh interval corresponding to the refresh information, generating an auto refresh command according to the controlled auto refresh interval, and transmitting the generated auto refresh command to the semiconductor memory devices of a corresponding group.

6. The memory system of claim 4, wherein the memory module has a structure in which the semiconductor memory devices of the first and second groups are mounted on opposite surfaces of a module substrate for each group.

7. The memory system of claim 4, wherein the memory module has a structure in which the semiconductor memory devices of the first and second groups are stacked on at least one surface of a module substrate in multiple layers, and the semiconductor memory devices of the first and second groups are classified into different groups according to the number of a layer of the multiple layers where the semiconductor memory devices are stacked.

8. A memory system comprising:
at least one memory module,
wherein each of the memory modules comprises semiconductor memory devices classified into first and second groups according to a position of the semiconductor memory devices which input and output data by being respectively controlled by a memory controller, wherein temperature of the semiconductor memory devices varies based on the position of the semiconductor memory devices,
wherein each of the semiconductor memory devices of the first and second groups comprises:
a refresh information storing circuit storing refresh information output from the memory controller, wherein the refresh information reflects the temperature variation with the position of the semiconductor memory devices; and
a refresh control circuit controlling a self-refresh interval according to the refresh information and performing a self-refresh operation according to the controlled self-refresh interval.

9. The memory system of claim 8, wherein the refresh control circuit comprises:
a refresh period control portion generating a refresh clock signal having a variable frequency based on the refresh information; and
a refresh counter sequentially generating a wordline address in response to the refresh clock signal.

10. The memory system of claim 8, wherein the refresh information storing circuit comprises an MRS (mode register set) circuit storing the refresh information in a mode register in response to an MRS command.

11. The memory system of claim 8, wherein the refresh information input to the semiconductor memory devices of the first group and the refresh information input to the semiconductor memory devices of the second group indicate different self-refresh intervals.

12. The memory system of claim 11, wherein the semiconductor memory devices of the first and second groups are classified into different groups according to memory banks.

13. The memory system of claim 11, wherein the memory module has a structure in which the semiconductor memory devices of the first and second groups are mounted on opposite surfaces of a module substrate for each group.

14. The memory system of claim 11, wherein the memory module has a structure in which the semiconductor memory devices of the first and second groups are stacked on at least one surface of a module substrate in multiple layers, and the semiconductor memory devices of the first and second groups are classified into different groups according to the number of a layer of the multiple layers where the semiconductor memory devices are stacked.

15. The memory system of claim 8, wherein the refresh information is transmitted with a self-refresh command by the memory controller.

16. The memory system of claim 15, wherein, when receiving the self refresh command and the refresh information from the memory controller, the semiconductor memory devices of the first group changes the refresh information according to a predetermined rule and transmits the changed refresh information with the self-refresh command to the semiconductor memory devices of the second group.

17. A memory module comprising:
semiconductor memory devices classified into first and second groups according to a position of the semiconductor memory devices which input and output data by being respectively controlled by a memory controller, wherein temperature of the semiconductor memory devices varies based on the position of the semiconductor memory devices,
wherein each of the semiconductor memory devices of the first and second groups comprises:
a refresh information storing circuit storing refresh information output from the memory controller, wherein the refresh information reflects the temperature variation with the position of the semiconductor memory devices; and
a refresh control circuit controlling a self-refresh interval according to the refresh information and performing a self-refresh operation according to the controlled self-refresh interval.

18. The memory module of claim 17, wherein the refresh information input to the semiconductor memory devices of the first and second groups indicate different self-refresh intervals.

19. The memory module of claim 17, wherein the memory module has a structure in which the semiconductor memory devices of the first and second groups are stacked on at least one surface of a module substrate in multiple layers, and the semiconductor memory devices of the first and second groups are set to have different self-refresh intervals according to the number of a layer of the multiple layers where the semiconductor memory devices are stacked.

20. A memory module comprising:
semiconductor memory devices classified into first, second, third and fourth groups according to a position of the semiconductor memory devices which input and output data by being respectively controlled by a memory controller, wherein temperature of the semiconductor memory devices varies based on the position of the semiconductor memory devices,
wherein each of the semiconductor memory devices of the first, second, third and fourth groups comprises:
a refresh information storing circuit storing refresh information output from the memory controller, which the refresh information reflects the temperature variation with the position of the semiconductor memory devices, and
a refresh control circuit controlling a self-refresh interval according to the refresh information and performing a self-refresh operation according to the controlled self-refresh interval, and
wherein wherein the memory module has a structure in which the semiconductor memory devices of the first and second groups are stacked on at least one surface of a module substrate in multiple layers, and the semiconductor memory devices of the first and second groups are set to have different self-refresh intervals according to the number of a layer of the multiple layers where the semiconductor memory devices are stacked, and
wherein the semiconductor memory devices of the first group are stacked on a first layer of a first surface of the module substrate, the semiconductor memory devices of the second group are stacked on a second layer of the first surface of the module substrate, the semiconductor memory devices of the third group are stacked on a third layer of the first surface of the module substrate, the semiconductor memory devices of the fourth group are stacked on a fourth layer of the first surface of the module substrate, and the self-refresh intervals of the semiconductor memory devices of the first through fourth groups become slower in order of the second, third, first, and fourth groups.

21. The memory module of claim 20, wherein the refresh information is transmitted with a self-refresh command by the memory controller.

22. The memory module of claim 21, wherein, when receiving the self refresh command and the refresh information from the memory controller or other semiconductor memory devices, each of the semiconductor memory devices of the first through third groups changes the refresh information according to a predetermined rule and transmits changed refresh information with the self-refresh command to other semiconductor memory devices of the second group.

23. A method for controlling refresh of semiconductor memory devices classified into at least first and second groups on a memory module according to a position of the semiconductor memory devices, wherein temperature of the semiconductor memory devices varies based on the position of the semiconductor memory devices, the method comprising:
the semiconductor memory devices of the first and second groups receiving different refresh information from a memory controller and storing the received refresh information, wherein the refresh information reflects the temperature variation with the position of the semiconductor memory devices;
receiving a self-refresh command from the memory controller;
controlling a self-refresh interval according to the refresh information; and
performing a self-refresh operation according to the controlled self-refresh interval.

24. The method of claim 23, wherein, in the memory module having a structure in which semiconductor memory devices are stacked in multiple layers, the refresh information changes according to the number of a layer of the multiple layers where the semiconductor memory devices are stacked.

25. A method for controlling refresh of a plurality of semiconductor memory devices, the method comprising:
classifying the semiconductor memory devices into at least first and second groups according to a position of the semiconductor memory devices, wherein temperature of the semiconductor memory devices varies based on the position of the semiconductor memory devices;
storing refresh information of the first and second groups, wherein the refresh information reflects the temperature variation with the position of the semiconductor memory devices; and
controlling an auto refresh interval corresponding to the refresh information, generating an auto refresh command according to the controlled auto refresh interval, and transmitting the generated auto refresh command to the semiconductor memory devices of a corresponding group.

* * * * *

UNITED STATES PATENT AND TRADEMARK OFFICE
CERTIFICATE OF CORRECTION

PATENT NO. : 7,543,106 B2
APPLICATION NO. : 11/504421
DATED : June 2, 2009
INVENTOR(S) : Joo-Sun Choi It is certified that error appears in the above-identified patent and that said Letters Patent is hereby corrected as shown below:

Column 14, line 40 delete "which" and insert --wherein--

Signed and Sealed this

Sixth Day of October, 2009

David J. Kappos
*Director of the United States Patent and Trademark Office*